United States Patent
Li et al.

[11] Patent Number: 6,012,469
[45] Date of Patent: Jan. 11, 2000

[54] ETCH RESIDUE CLEAN

[75] Inventors: Li Li, Meridian; Donald L. Westmoreland; Donald L. Yates, both of Boise, all of Id.

[73] Assignee: Micron Technology, Inc., Boise, Id.

[21] Appl. No.: 08/932,737

[22] Filed: Sep. 17, 1997

[51] Int. Cl.⁷ .............................. H01L 21/302; B08B 6/00
[52] U.S. Cl. ........................ 134/1.3; 438/704; 438/974; 438/963; 438/906; 438/629; 438/637; 438/640; 438/696; 438/750
[58] Field of Search ........................... 438/974, 963, 438/906, 629, 637, 640, 704, 710, 696, 750; 134/1.3

[56] References Cited

U.S. PATENT DOCUMENTS

| | | | |
|---|---|---|---|
| 4,569,722 | 2/1986 | Maury et al. | 156/657 |
| 5,320,709 | 6/1994 | Bowden et al. | 156/667 |
| 5,412,868 | 5/1995 | Nguyen et al. | 29/852 |
| 5,567,574 | 10/1996 | Hasemi et al. | 430/331 |
| 5,630,904 | 5/1997 | Aoyama et al. | 438/669 |

FOREIGN PATENT DOCUMENTS

| | | |
|---|---|---|
| 3-082127 | 4/1991 | Japan . |
| 5-235176 | 9/1993 | Japan . |
| 6-216082 | 8/1994 | Japan . |
| 7-283204 | 10/1995 | Japan . |
| 8-202051 | 8/1996 | Japan . |
| WO97/02958 | 1/1997 | WIPO . |

*Primary Examiner*—William Powell
*Assistant Examiner*—George Goudreau
*Attorney, Agent, or Firm*—Workman, Nydegger & Seeley

[57] ABSTRACT

A method for cleaning polymer film residues from in-process integrated circuit devices is disclosed. Specifically, a method for forming a contact via in an integrated circuit is disclosed in which the formation of a metallization conductive element is exposed through a dry anisotropic etch. During the etch, a polymer film residue forms from masking materials, and coats the newly-formed via. The polymer film may have metals incorporated metals therein from the metallization conductive element. A fluorine based etchant is used to remove the polymer film. Protection of the metallization conductive element during the cleaning process is accomplished with passivation additives comprising straight, branched, cyclic, and aromatic hydrocarbons. Attached to the hydrocarbons are functional groups comprising at least 3 hydroxyls.

43 Claims, 3 Drawing Sheets

ETCH RESIDUE CLEAN

BACKGROUND OF THE INVENTION

1. The Field of the Invention

The present invention relates to via etch processing in which a via etch residue is removed after the etch. In particular, the present invention relates to a method of cleaning an etched via having polymer film residue thereon that forms in a dry anisotropic etch. The present invention accomplishes the cleaning method to remove the dry via etch residue with minimal damage to structures that have been exposed by the dry via etch.

2. The Relevant Technology

In the microelectronics industry, a substrate refers to one or more semiconductor layers or structures which include active or operable portions of semiconductor devices. The term substrate assembly is intended herein to mean a substrate having one or more layers or structures formed thereon. As such, the substrate assembly may be, by way of example and not by way of limitation, a doped silicon semiconductor substrate typical of a semiconductor wafer.

In semiconductor integrated circuits, construction of devices in stacked layers is required to facilitate the ever-present pressure upon the industry to miniaturize. Stacked device layers require interconnects to electrically wire the stacked devices together into a coherent integrated circuit. Formation of interconnect layers are made functional by interconnect signal lines that make contact between upper and lower conductive layers in the integrated circuit by way of vias though interlevel dielectric layers. For best operation of an integrated circuit that has multiple stacked layers with interconnects, lower conductive layers must not be damaged during formation of the via or the interconnect to be formed therein.

Various interlevel insulating layers are deposited on the integrated circuit during formation of the device. These layers separate the conductive layers from each other and act as insulators as well as structural supports. One method to form a via having an interconnect therein through these insulating layers is to etch through a mask to define a location for the interconnect via. Masks can be made of various materials, including curable polymers. After mask formation, a dry anisotropic etch is conducted to form the interconnect via Anisotropic dry etching causes some of a polymer mask to partially dissolve and form a polymer film within the interconnect via during its formation. The polymer film can assist the dry anisotropic etch by resisting lateral etching by the etching medium.

During partial dissolution of the mask that occurs while the dry etch is progressing, lower level metallization layers can become exposed and may also be etched, either by design, or incidental to the etch. Etched metallization materials are often reactively incorporated into the polymer film as it forms upon the newly etched interconnect surfaces, including the exposed surfaces of lower level metallization layers. The polymer film formed during such etching needs to be removed to allow proper contact to be made in the interconnect via between conductive layers.

Because underlying metallization becomes incorporated into the polymer film, removal of the film with conventional photoresist solvents is often inadequate. Prior art methods of removal of the polymer films include dissolution through use of a solvent, acid, or plasma etch. During these processes, however, underlying metallization can also be removed in a way that compromises the integrity of the device that the underlying metallization is designed to contact.

FIGS. 1 through 4 depict formation of an interconnect via 12 as known in the prior art. In FIG. 1, an integrated circuit detail 10 is shown in cross-section, wherein a polymer mask 14 has been deposited and pattered upon an $SiO_2$ isolation layer 18. A dry anisotropic etch has opened an interconnect via 12 that penetrates through each of isolation layer 18, a TiN anti-reflective layer 20, and partially into an aluminum alloy metallization layer 22.

Typical of the formation of interconnect via 12, there is illustrated in FIG. 1 further structures that connect an upper layer to a lower layer. A second conductive layer 24, that may comprise titanium nitride for example, is situated upon a first liner layer 26 that may comprise metallic titanium. Metallization layer 22 is in electrical contact with a tungsten plug 30 through second conductive layer 24 and first liner layer 26. A second liner layer 28 which can be by way of example a titanium nitride layer that lines plug 30 which is embedded in a lower insulation layer 32 that may be BPSG, by way of example. Plug 30 makes electrical contact with structures below lower insulation layer 32, such as an active area 38.

In FIG. 1 the results of a dry anisotropic etch are illustrated, wherein a polymer film 16 has been formed within interconnect via 12. Polymer film 16 was formed by partial dissolution of polymer mask 14 and chemical-reactive intermingling of etched metallization layer 22 with polymer mask 14.

FIG. 2 illustrates integrated circuit detail 10 following stripping of polymer mask 14. It can be seen that polymer film 16 formed within interconnect via 12 was not removed by stripping of polymer mask 14. According to methods of the prior art, a more aggressive stripping solution is required to remove polymer film 16 than a stripping solution used to remove polymer mask 14. While more aggressive stripping solution are desired, it is also desirable to avoid stripping solutions that are not environmentally inert.

FIG. 3 illustrates the results of a prior art effort to remove polymer film 16. Typically, a plasma etch or an etch known in the art as a piranha etch, which contains a solution of hydrogen peroxide and sulfuric acid, is used to remove polymer film 16. One skilled in the art will recognize that more aggressive etchants such as the piranha etch will remove a substantial portion of metallization layer 22, although the time required to remove polymer film 16 is held to a minimum. Thus, the acid or etchant used to remove polymer film 16 creates an undesirable pit 34 in metallization layer 22.

If a plasma etch is used to remove polymer film 16, undesirable pit 34 can also be undesirably formed in metallization layer 22 due to the overetching inherently required to insure complete removal of polymer film 16. If the etch is not performed long enough, some of polymer film 16 will not be removed. Thus, a plasma etch presents a tradeoff. Either holes are formed in metallization layer 22 or not all of polymer film 16 is removed.

Another problem encountered with plasma or acid etching is that such etching removes a portion of insulation layer 18 such that interconnect via 12 widens at least at an upper surface 40 of insulation layer 18. Widening of interconnect via 12 at upper surface 40 increases the size of interconnect via 12. Such widening, if not properly controlled, can cause interconnect via 12 to destructively overlap with other interconnect vias, causing a defect condition and thus reducing fabrication yield.

With over-aggressive etching, pit 34 may form within metallization layer 22. Pit 34 makes filling of interconnect via 12 difficult because of an undercutting 42 into metallization layer 22 below an optional anti-reflective layer 20 and insulation layer 18. Pit 34 creates a thin structure 44 within metallization layer 22. Thin structure 44 can cause field failures of integrated circuit detail 10 by breach of metallization layer 22, for example, due to aluminum ion electromigration caused by heated structures and increased electrical resistance within thin structure 44. Electromigration eventually leads to additional thinning of thin structure 44 until metallization layer 22 becomes discontinuous and a field failure within integrated circuit detail 10 results.

FIG. 4 illustrates another prior art problem caused by aggressive etching to remove polymer film 16. When etching is too aggressive, pit 34 penetrates entirely through metallization layer 22 into other structures and metallization layer 22 is electrically disconnected. This type of problem arises during fabrication and is a yield-decreasing failure.

What is needed is a method of forming interconnect vias in integrated circuits that includes a polymer film removing process that effectively removes a polymer film without damaging an underlying metallization layer, and preferably by using environmentally inert processes.

SUMMARY OF THE INVENTION

The present invention relates to cleaning of semiconductor structures following dry anisotropic etching, wherein a polymer film residue is removed that forms within an anisotropically etched hole. During the etch, the polymer film residue forms in part from masking materials and metallization layers, and coats the newly-formed hole or via. The polymer film may have metals incorporated therein that originate from the metallization layer. Such metals are more resistant to removal than the masking materials during mask stripping. An HF cleaning solution is used to remove the polymer film. Protection of the metallization layer during the HF cleaning process is accomplished with metallization layer passivation additives.

The inventive cleaning process comprises a preferred etchant and a metallization layer passivation additive that serves as a passivator or buffer that passivates or buffers preferred structures such as metallization layers that do not require further etching. The inventive cleaning process may be used simultaneously with stripping of the masking material, following stripping of the masking material, or by a process in which stripping of the masking material and removing of the etch film at least partially overlap in the cleaning process.

Preferred etchants used in the inventive cleaning process comprise weak acids such as HF. Preferred additives comprise polyhydroxyls comprising at least three hydroxyl groups that may be attached to straight, branched, and aromatic hydrocarbons, saccharides, polyhydroxyl amines, and polyhydroxyl phosphates.

The method of the present invention further comprises an anisotropic dry etch, the inventive cleaning process described above, a DI rinse, and a drying step. Cleaning times are selected according to the specific application.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The process steps and structures described below are intended to be integral with a complete process flow for manufacturing integrated circuits. The present invention can be practiced in conjunction with integrated circuit fabrication techniques currently used in the art which are necessary for an understanding of the present invention. The figures representing cross-sections of portions of an integrated circuit during fabrication are not drawn to scale, but instead are drawn so as to illustrate the important features of the invention.

Figure 1:
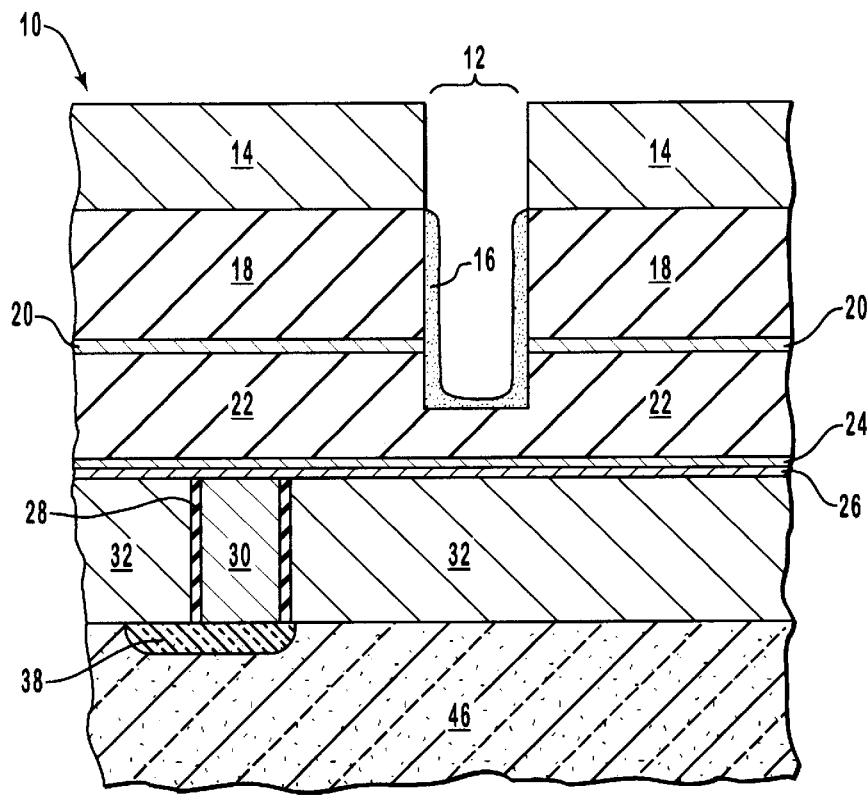
FIG. 1 is a cross-sectional detail of a multi-level integrated circuit device in which an interconnect via has been etched, where some of a polymer mask has mobilized and combined with etched metallization materials to form a polymer film lining the interconnect via, and where the polymer film is resistant to removal with conventional polymer mask stripping processes.
Figure 2:
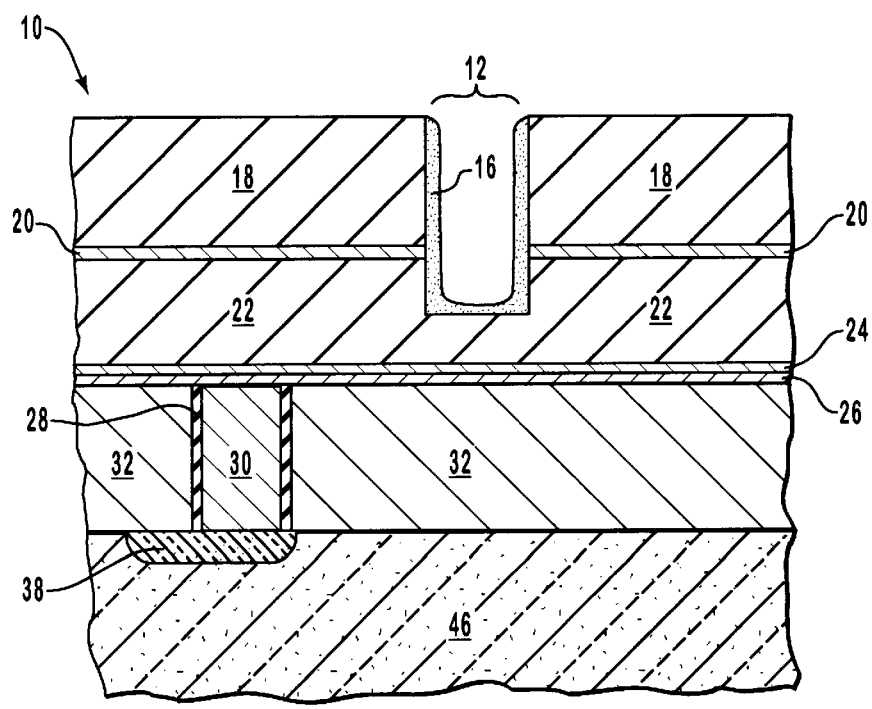
FIG. 2 is a cross-sectional detail illustrating the device of FIG. 1 after removal of the polymer mask, in which the polymer film has resisted removal.

The present invention relates to cleaning of polymer film 16 from within interconnect via 12 without compromising remaining portions of metallization layer 22, as seen in FIGS. 1 and 2. Preferred etchants are selected that act to aggressively remove polymer film 16 without attacking metallization layer 22 within a selected time window required to remove polymer film 16. By way of example, preferred etchants comprise weak acids such as hydrofluoric acid, acetic acid, benzoic acid, boric acid, carbonic acid, formic acid, nitrous acid, phosphoric acid, propionic acid, hydrogen sulfate, and equivalents. Basic etchants such as the ammonium ion are also preferred. Most preferred are etchants which are fluorine-based and which are capable of polarizing and breaking silicon and oxide bonds. These fluorine-based etchants include combinations of hydrofluoric acid and ammonium fluoride mixtures.

Weak acids are preferred in the method of the present invention because a strong acid would make ineffective a preferred additive that passivates the surface of metallization layer 22 in a way that allows the method of the present invention to remove polymer film 16 without attacking metallization layer 22. For example, the components of a piranha etch, comprising hydrogen peroxide and sulfuric acid, are known to strip hydroxyl groups from compounds containing them, thus making the piranha etch and equivalents ineffective in connection with the present invention.

Additives of the present invention comprise at least four different groups. The groups consist of alcohols comprising at least three hydroxyl groups, saccharides, polyhydroxyl amines, and polyhydroxyl phosphorous compounds.

Alcohols used in the present invention comprise primary, secondary, and tertiary alcohols. The primary alcohols comprise configurations of straight-chain, branched, cyclic, and aromatic alcohols that each comprise at least three hydroxyl groups. For example, a primary alcohol used in the present invention may comprise propyltriol. A more complex primary alcohol of the present invention may comprise dulcitol.

The simplest secondary alcohol used in the method of the present invention comprises $(R)_2CHOH$, wherein $(R)_2$ comprises straight, branched, cyclic, or aromatic structures with a total of at least two more hydroxyls attached. The simplest tertiary alcohol used in the method of the present invention comprises $(R)_3CHOH$, wherein $(R)_3$ comprises straight, branched, cyclic, or aromatic structures with a total of at least two more hydroxyls attached. For example, a tertiary alcohol such as pentaerythritol ($HOCH_2C(HOCH_2)_2CH_2OH$) may be used.

Alcohols that are used as additives in the method of the present invention, whether primary, secondary, or tertiary, require that at least three hydroxyl groups are attached.

The second group of additives that are used with the method of the present invention comprises saccharides. The simplest saccharides comprise such compounds as erythrose or threose, wherein most of these compounds have at least three hydroxyl groups. Other saccharides comprise ribose, arabinose, xylose, lyxose and the more well-known saccharides such as glucose, mannose, dextrose, levrose, galactose, and equivalents. Other saccharides may be used with the method of the present invention. Such saccharides include cellulose, chitin, and amylose, however with some of these saccharides, additional compounds may be required to dissolve the saccharides in an aqueous solution.

The third preferred additive to be used with etchants in the method of the present invention comprise polyhydroxyl amines. As with the alcohols and saccharides used in the present invention, polyhydroxyl amines may comprise primary, secondary, and tertiary amines. For example, triethanol amine is used with the method of the present invention in conjunction with hydrofluoric acid.

The fourth group of preferred additives used with etchants in the method of the present invention comprise phosphates such as phosphoric acid and phosphate ethers, wherein at least three hydroxyl groups are attached to the base phosphate structure.

Figure 5:
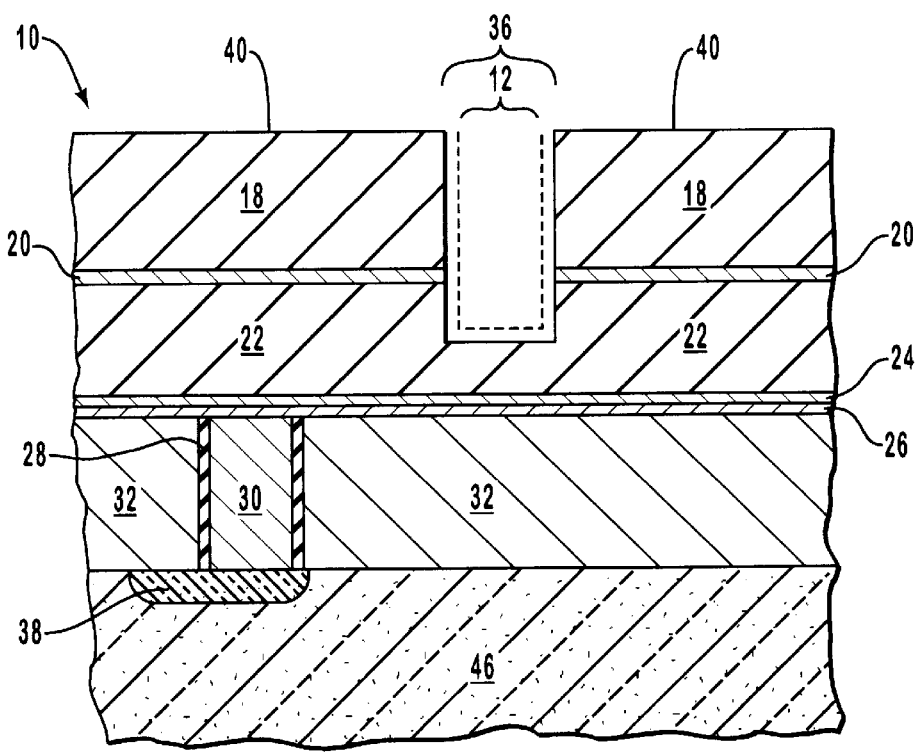
FIG. 5 is a cross-sectional detail illustrating the result of the method of the present invention in which an interconnect via has been cleaned without compromising insulation layers, conductive layers, or structures beneath the interconnect via, and by which only minimal via widening and minimal further etching of the metallization layer has occurred.

The present invention, as illustrated in FIGS. 1, 2, and 5, comprises a method of cleaning integrated circuit detail 10 using a preferred etchant in conjunction with a preferred additive to remove polymer film 16 in such a manner that further etching of metallization layer 22 is minimized. In a preferred embodiment of the present invention, integrated circuit detail 10 shows a cross-section of an interlayer dielectric comprising insulation layer 18, and a hole comprising interconnect via 12 that is a mid-process structure that will be filled to electrically connect plug 30 with active area 38 and other microelectronic devices that will be formed up on upper surface 40. In the preferred embodiment of the present invention, a 100 mL aqueous solution of etchant and additive is prepared. One gram of HF that is 49% HF in water and one gram of dulcitol are diluted to a 100 mL solution.

The inventive cleaning solution has concentrations of etchant and additive that may have a range that optimizes removal of polymer film 16 without compromising metallization layer 22. In the example of the present invention, the inventive cleaning solution may comprise a concentration range from about 0.001 to about 15% HF or other fluorine based etchant, and from about 0.01 to about 50% dulcitol.

Preferred concentrations of etchants and additives can be ascertained initially by comparison of the disassociation constant, $K_A$, of HF in the preferred embodiment illustrated in FIGS. 1, 2, and 5, and with the knowledge that the percent of disassociation of acids increases with decreasing concentration. Thus, stronger etchants such as phosphoric acid may be used in concentrations less than the concentration of HF, depending upon the preferred additive being used and depending upon the surfaces that will be contacted with the cleaning solution. It is within the level of one of ordinary skill in the art within routine experimentation to apply this cleaning solution without forming pit 34 or a destructively widening interconnect via 12 as illustrated at reference numeral 42 in FIGS. 3 and 4, to structures that are diverse and unlike.

In the preferred embodiment for the structure illustrated in FIG. 1, the method of the present invention comprises patterning polymer mask 14, dry etching anisotropically to form interconnect via 12, stripping polymer mask 14, cleaning integrated circuit 10 with the inventive cleaning solution comprising HF and dulcitol, rinsing with DI water, and applying a drying step known in the art such as an anhydrous isopropyl alcohol (IPA) drying.

The time required to apply the inventive solution depends upon the specific application and the etch or cleaning chemistry of the structures exposed to the inventive cleaning solution. In this example of a preferred embodiment, the cleaning time is preferably less than 90 seconds. It is within the level of one of ordinary skill in the art to develop optimum cleaning times depending upon the specific application of the inventive cleaning.

Metallization layer 22 may comprise aluminum, aluminum-copper alloys, doped polysilicon, and other electrically-conductive materials that are known equivalents in the art. Doped polysilicon resists further etching using the inventive cleaning process more than metals. Depending upon the acid or etchant used, however, doped polysilicon can be compromised and metallization pit 34 may form even in doped polysilicon.

Figure 3:
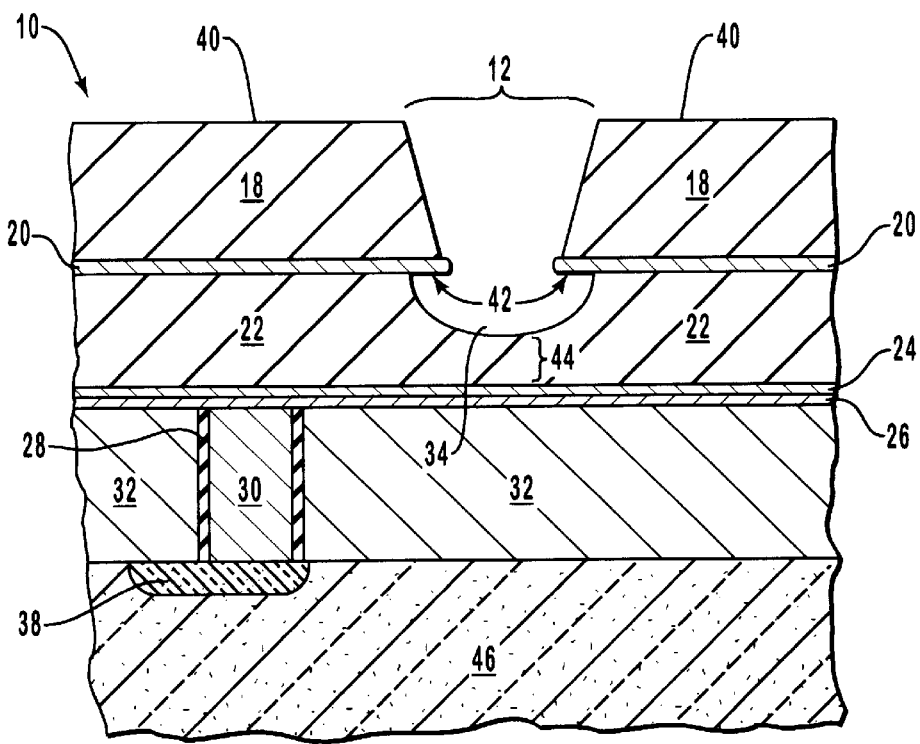
FIG. 3 is a cross-sectional detail illustrating the prior art problem of unwanted interconnect via widening and of pitting of an underlying metallization layer, thus rendering the underlying metallization layer susceptible to field failure due to enhanced electromigration caused by thinning of the underlying metallization layer at the locus of the pitting.
Figure 4:
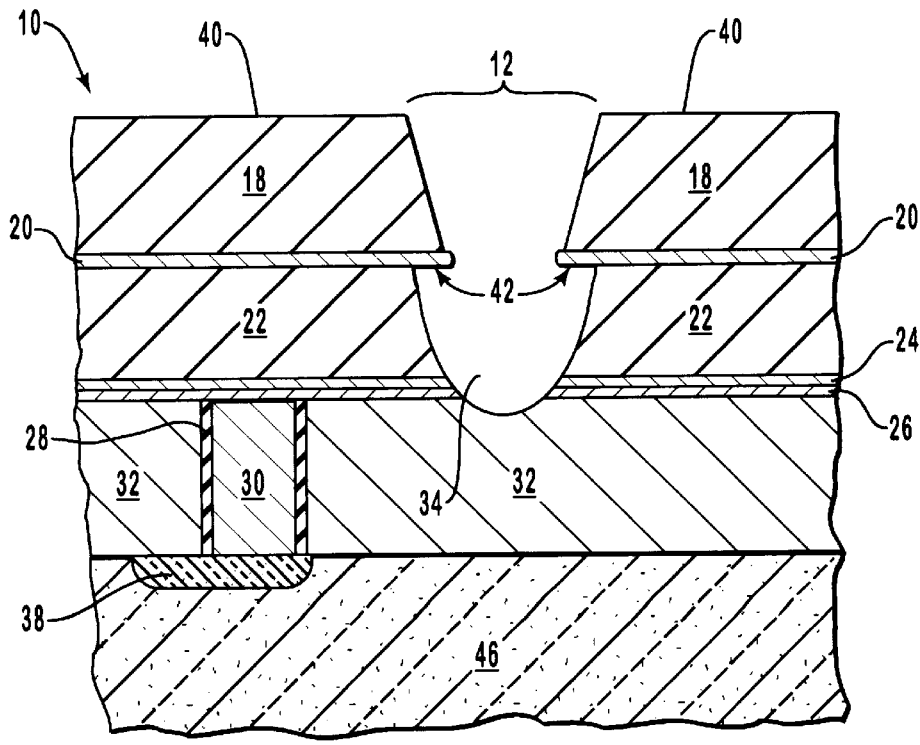
FIG. 4 is a cross-sectional detail illustrating a prior art problem of unwanted interconnect via widening and of pitting of the underlying metallization layer, where such pitting has broken through the metallization layer, thus causing a failed device and a lower fabrication yield.

An alternative embodiment of the present invention comprises patterning polymer mask 14, isotopically etching interconnect via 12, applying the inventive cleaning, wherein polymer mask 14, polymer film 16, portions of insulation layer 18, and metallization layer 22 are simultaneously removed during the inventive cleaning. This alternative method continues with a standard DI rinse, and a drying technique known in the art. In this alternative embodiment, it can be seen that both polymer mask 14 and polymer film 16 are simultaneously removed. Because of the preferred chemistry of the inventive cleaning, further removal of insulation layer 18 and metallization layer 22 are minimal such that, as illustrated in FIG. 5, interconnect via 12 has been enlarged to form a cleaned interconnect via 36. It is within the level of one of ordinary skill in the art to apply this alternative cleaning process without forming metallization pit 34 or a destructively widening interconnect via as illustrated in FIGS. 3 and 4 seen at reference numeral 42.

Figure 6:
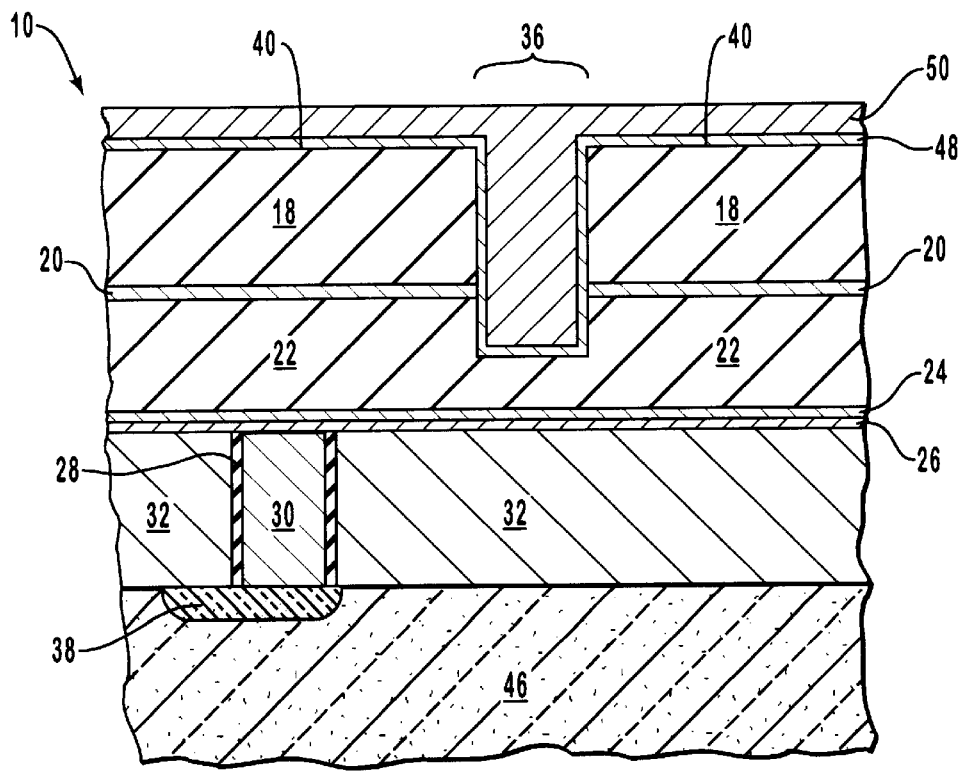
FIG. 6 is a cross-sectional detail illustrating formation of an interconnect within a hole that has been cleared of a polymer etch film that was created by dry anisotropic etching, and illustrates that the method of the present invention is sufficient for forming a plug or a plug in a unitary structure a metallization layer.

Further processing by the method of the present invention can be seen as illustrated in FIG. 6. Following removal of polymer film 16, an optional titanium or titanium alloy liner layer 48 may be deposited by PVD or CVD upon upper surface 40 and within cleaned interconnect via 36. Optionally, liner layer 48 may be placed only within interconnect via 36 by appropriate masking prior to deposition.

Following placement of optional liner layer 48, a second metallization layer 50 is deposited over upper surface 40 and within cleaned interconnect via 36. Hole filling of second metallization layer 50 may be required. Hole filling of second metallization layer 50 into cleaned interconnect via 36 is accomplished by various methods such as rapid thermal processing (RTP) reflow, by low pressure CVD (LPCVD) that allows cleaned interconnect via 36 to fill in a substantial "bottom-to-top" filling mode that prevents poor step coverage, or by high-pressure filling. Optionally, chemical-mechanical polishing (CMP) may be done to remove all of second metallization layer 50 above upper surface 40, and further metallization (not shown) can then be formed upon upper surface 40 and over second metallization 50 that has filled cleaned interconnect via 36.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of removing a residual etch film comprising:
   selectively removing a portion of a dielectric layer situated over a metallization layer with an etching process to form an etch hole, said etching process forming a residual etch film upon:
      a surface upon said dielectric layer within said etch hole; and
      a surface upon said metallization layer within said etch hole;
   removing said residual etch film from said surface of said dielectric layer and from said surface of said metallization layer using a solution comprising dulcitol.

2. A method of removing a residual etch film according to claim 1, wherein said etching process is a dry anisotropic etching process.

3. A method of removing a residual etch film according to claim 1, wherein prior to said selectively removing a portion of a dielectric layer, said method further comprises forming a mask substantially comprised of a polymer material upon said dielectric layer, and wherein said residual etch film is at least in part comprised of materials from said polymer material.

4. A method of removing a residual etch film according to claim 1, wherein after removing said residual etch film, said method further comprises rinsing said surface of said dielectric layer and said surface of said metallization layer.

5. A method of removing a residual etch film according to claim 4, wherein rinsing comprises rinsing with DI water.

6. A method of removing a residual etch film according to claim 4, wherein after rinsing said surface of said dielectric layer and said surface of said metallization layer, said method further comprises drying said surface of said dielectric layer and said surface of said metallization layer.

7. A method of removing a residual etch film according to claim 1, wherein said solution further comprises:
   an etchant.

8. A method of removing a residual etch film according to claim 7, wherein said etchant is a fluorine based etchant that is capable of polarizing and breaking silicon and oxide bonds.

9. A method of removing a residual etch film according to claim 7, wherein said etchant is HF.

10. A method of removing a residual etch film according to claim 7, wherein said etchant is an acid.

11. A method of removing a residual etch film according to claim 10, wherein said acid is selected from the group consisting of acetic acid, benzoic acid, boric acid, carbonic acid, formic acid, nitrous acid, phosphoric acid, propionic acid, and hydrogen sulfate.

12. A method of removing a residual etch film according to claim 7, wherein said etchant is a base.

13. A method of forming an interconnect comprising:
   selectively removing a portion of a dielectric layer situated over a metallization layer with an etching process to form an etch hole, said etching process forming a residual etch film upon:
      a surface upon said dielectric layer within said etch hole; and
      a surface upon said metallization layer within said etch hole;
   removing said residual etch film from said surface of said dielectric layer and from said surface of said metallization layer using a solution comprising dulcitol; and
   forming a conductive material within said etch hole.

14. A method of forming an interconnect according to claim 13, wherein said conductive material is a metallization material.

15. A method of forming an interconnect according to claim 14, wherein said metallization material is selected from the group consisting of aluminum, aluminum alloys, titanium, titanium nitride, tungsten, and polysilicon.

16. A method of forming an interconnect according to claim 14, wherein said forming further comprises filling said hole.

17. A method of forming an interconnect according to claim 16, wherein said filling said hole comprises reflow of said metallization material.

18. A method of forming an interconnect according to claim 16, wherein said filling said hole comprises pressure filling of said metallization material.

19. A method of forming an interconnect according to claim 16, wherein said filling said hole comprises LPCVD of said metallization material.

20. A method of forming an interconnect according to claim 13, wherein said solution further comprises an etchant.

21. A method of forming an interconnect according to claim 20, wherein said etchant is an acid.

22. A method of forming an interconnect according to claim 21, wherein said acid is selected from the group consisting of HF, acetic acid, benzoic acid, boric acid, carbonic acid, formic acid, nitrous acid, phosphoric acid, propionic acid, and hydrogen sulfate.

23. A method of forming an interconnect according to claim 20, wherein said etchant is a base.

24. A method of forming an interconnect according to claim 20, wherein said etchant is a fluorine based etchant that is capable of polarizing and breaking silicon and oxide bonds.

25. A method of forming an interconnect according to claim 24, wherein said fluorine based etchant is an aqueous fluorine based etchant in said solution in the concentration range from about 0.001 to 15%.

26. A method of forming an interconnect according to claim 13, wherein said forming comprises:
   depositing an aluminum alloy upon said dielectric layer; and
   filling said aluminum alloy into said hole.

27. A method of removing a residual etch film according to claim 13, wherein prior to said selectively removing a portion of a dielectric layer, said method further comprises forming a mask substantially comprised of a polymer material upon said dielectric layer, and wherein said residual etch film is at least in part comprised of materials from said polymer material.

28. A method of forming an interconnect comprising:
   patterning a mask substantially composed of a polymer material to expose thereunder a selected portion of a dielectric layer;
   anisotropically etching said portion of said dielectric layer in a dry etch process to form an etch hole, said dielectric layer being situated over a metallization layer, wherein said dry etching process forms a residual etch film at least in part comprised of materials from said polymer material, said residual etch film being situated upon:
      a surface upon said dielectric layer within said etch hole; and
      a surface upon said metallization layer within said etch hole;
   removing said residual etch film from said surface of said dielectric layer and from said surface of said metallization layer using a solution comprising dulcitol;
   rinsing said surface of said dielectric layer and said surface of said metallization layer;
   drying said surface of said dielectric layer and said surface of said metallization layer; and
   filling said etch hole with a metallization layer.

29. A method of forming an interconnect according to claim 28, wherein said solution further comprises an etchant.

30. A method of removing a residual etch film according to claim 28, wherein said solution further comprises:
   an etchant.

31. A method of removing a residual etch film according to claim 30, wherein said etchant is a fluorine based etchant that is capable of polarizing and breaking silicon and oxide bonds.

32. A method of removing a residual etch film according to claim 30, wherein said etchant is HF.

33. A method of removing a residual etch film according to claim 30, wherein said etchant is an acid.

34. A method of removing a residual etch film according to claim 33 wherein said acid is selected from the group consisting of acetic acid, benzoic acid, boric acid, carbonic acid, formic acid, nitrous acid, phosphoric acid, propionic acid, and hydrogen sulfate.

35. A method of removing a residual etch film according to claim 30, wherein said etchant is a base.

36. A method of removing a residual etch film comprising:
   patterning a mask substantially composed of a polymer material to expose thereunder a selected portion of an $SiO_2$ dielectric layer;
   anisotropically etching said portion of said $SiO_2$ dielectric layer in a dry etch process to form an etch hole, said $SiO_2$ dielectric layer being situated over an aluminum alloy metallization layer, wherein said dry etch process forms a residual etch film at least in part comprised of materials from said polymer material, said residual etch film being situated upon:
      a surface upon said $SiO_2$ dielectric layer within said etch hole; and
      a surface upon said aluminum alloy metallization layer within said etch hole;
   removing said residual etch film from said surface of said $SiO_2$ dielectric layer and from said surface of said aluminum alloy metallization layer using an aqueous fluorine etchant solution in a mixture with dulcitol;
   rinsing said surface of said $SiO_2$ dielectric layer and said surface of said aluminum alloy metallization layer;
   drying said $SiO_2$ surface of said dielectric layer and said surface of said aluminum alloy metallization layer; and
   filling said etch hole with a metallization layer.

37. A method of removing a residual etch film according to claim 36, further comprising:
   rinsing said $SiO_2$ dielectric layer and said aluminum alloy metallization layer with DI water; and
   drying said $SiO_2$ dielectric layer and said aluminum alloy metallization layer with an anhydrous liquid.

38. A method of removing a residual etch film according to claim 36, wherein said aqueous fluorine based etchant solution is in the concentration range from about 0.001 to 15%.

39. A method of removing a residual etch film according to claim 36, wherein said dulcitol is in the concentration range from about 0.01% to 50%.

40. A method of removing a residual etch film comprising:
   selectively removing a portion of a dielectric layer situated over a metallization layer with an etching process to form an etch hole, said etching process forming a residual etch film upon:
      a surface upon said dielectric layer within said etch hole; and
      a surface upon said metallization layer within said etch hole;
   removing said residual etch film from said surface of said dielectric layer and from said surface of said metallization layer using a solution comprising pentaerythritol $(HOCH_2C(HOCH_2)_2CH_2OH)$.

41. The method as defined in claim 40, wherein the solution further comprises an etchant.

42. A method of removing a residual etch film comprising:
   selectively removing a portion of a dielectric layer situated over a metallization layer with an etching process to form an etch hole, said etching process forming a residual etch film upon:
      a surface upon said dielectric layer within said etch hole; and
      a surface upon said metallization layer within said etch hole;
   removing said residual etch film from said surface of said dielectric layer and from said surface of said metallization layer using a solution comprising propyltriol.

43. The method as defined in claim 42, wherein the solution further comprises an etchant.

* * * * *

UNITED STATES PATENT AND TRADEMARK OFFICE
CERTIFICATE OF CORRECTION

PATENT NO.    : 6,012,469
DATED         : January 11, 2000
INVENTOR(S)   : Li Li, Donald L. Westmoreland and Donald L. Yates It is certified that error appears in the above-identified patent and that said Letters Patent is hereby corrected as shown below:

<u>Title page,</u>
Item [57], ABSTRACT,
Line 8, after "incorporated" delete "metals"

Signed and Sealed this

Twenty-sixth Day of November, 2002

Attest:

JAMES E. ROGAN
*Attesting Officer*  *Director of the United States Patent and Trademark Office*